(12) United States Patent
DeVito (10) Patent No.: US 8,758,580 B2
(45) Date of Patent: Jun. 24, 2014

(54) DEPOSITION SYSTEM WITH A ROTATING DRUM

(75) Inventor: Richard DeVito, Jamaica Plain, MA (US)

(73) Assignee: Vaeco Inc., Jamaica Plain, MA (US)

( * ) Notice: Subject to any disclaimer, the term of this patent is extended or adjusted under 35 U.S.C. 154(b) by 243 days.

(21) Appl. No.: 13/211,884

(22) Filed: Aug. 17, 2011

(65) Prior Publication Data

US 2012/0045588 A1 Feb. 23, 2012

Related U.S. Application Data

(60) Provisional application No. 61/376,181, filed on Aug. 23, 2010.

(51) Int. Cl.
*C23C 14/22* (2006.01)
*C23C 14/50* (2006.01)

(52) U.S. Cl.
USPC .............. 204/298.15; 204/298.11; 204/192.2; 204/192.13; 204/298.41; 204/192.12; 428/446; 438/643; 427/524; 118/716

(58) Field of Classification Search
None
See application file for complete search history.

(56) References Cited

U.S. PATENT DOCUMENTS

| | | | | |
|---|---|---|---|---|
| 5,470,388 | A | * | 11/1995 | Goedicke et al. ............. 118/716 |
| 5,858,471 | A | * | 1/1999 | Ray et al. ...................... 427/524 |
| 6,171,454 | B1 | * | 1/2001 | Weber et al. ............. 204/192.12 |
| 6,495,010 | B2 | | 12/2002 | Sferlazzo |
| 6,562,715 | B1 | * | 5/2003 | Chen et al. .................... 438/643 |
| 6,669,824 | B2 | | 12/2003 | Sferlazzo et al. |
| 2001/0002002 | A1 | * | 5/2001 | Flynn et al. ............... 204/298.41 |
| 2005/0121311 | A1 | * | 6/2005 | Shidoji et al. ............ 204/192.13 |
| 2007/0151842 | A1 | | 7/2007 | DeVito et al. |
| 2009/0226735 | A1 | * | 9/2009 | Nadaud et al. ................ 428/446 |
| 2009/0308739 | A1 | * | 12/2009 | Riker et al. ............... 204/298.11 |

OTHER PUBLICATIONS

Sproul, "Control of Reactive Sputtering Processes," Science Direct, Thin Solid Films, vol. 491, pp. 1-17, 2005; 17 pgs.
Thornton, "The Influence of Discharge Current on the Intrinsic Stress in Mo Films Deposited Using Cylindrical and Planar Magnetron Sputtering Sources," J. Vac. Sci. Technol. A, vol. 3, No. 3, May/Jun. 1985; 4 pgs.
Thornton, "Internal Stresses in Titanium, Nickel, Molybdenum, and Tantalum Films Deposited by Cylindrical Magnetron Sputtering," J. Vac. Sci. Technol. A, vol. 14, No. 1, Jan./Feb. 1977; 5 pgs.
Windischmann, "An Intrinsic Stress Scaling Law for Polycrystalline Thin Films Prepared by Ion Beam Sputtering," J. Appl. Phys. vol. 62, No. 5, Sep. 1, 1987; 8 pgs.
Gibson, "Flexible and High Throughput Deposition of Multilayer Optical Coatings Using Closed Field Magnetron Sputtering," 47th Annual Technical Conference Proceedings, Society of Vacuum Coaters, 2004; 5 pgs.

\* cited by examiner

*Primary Examiner* — Keith Hendricks
*Assistant Examiner* — Timon Wanga
(74) *Attorney, Agent, or Firm* — Reza Mollaaghababa; Thomas J. Engellenner; Pepper Hamilton LLP (57) ABSTRACT

A deposition method comprises flowing a first gas into a metallization zone maintained at a first pressure. A second gas flows into a reaction zone maintained at a second pressure. The second pressure is less than the first pressure. A rotating drum includes at least one substrate mounted to a surface of the drum. The surface alternately passes through the metallization zone and passes through the reaction zone. A target is sputtered in the metallization zone to create a film on the at least one substrate. The film on the at least one substrate is reacted in the reaction zone.

25 Claims, 9 Drawing Sheets

DEPOSITION SYSTEM WITH A ROTATING DRUM

CROSS-REFERENCE TO RELATED APPLICATIONS

This application is a utility application claiming priority to co-pending U.S. Provisional Application Ser. No. 61/376,181 filed on Aug. 23, 2010 entitled "A METHOD TO DEPOSIT REACTIVE FILMS ON A ROTATING CYLINDER," the entirety of which is incorporated by reference herein.

FIELD OF THE INVENTION

The invention relates generally to a thin film deposition system. More specifically, the invention relates to a deposition system with separate metallization and reaction zones for deposition of reactive films.

BACKGROUND

DC Magnetron Sputtering is a thin film deposition technique. For example, sputtering can occur in an environment containing Argon gas (Ar). A negative DC potential is applied to a conductive metal "target." A plasma discharge is established to ionize the gas thereby creating Ar+ ions. The positively charged Ar+ ions accelerate towards the negatively charged target and causes ejection of the target through sputtering, which in turn creates a metal film on an opposing placed substrate.

Introduction of reactive gases such as $O_2$ or $N_2$ can cause the film to take on properties of the compounds created by the reaction of these gases with the deposited metal film. Further ionization and acceleration of these reactive gases can enhance the reactivity between the gas and the film in addition to improving the density of the film as well as influence other film properties such the film stress, hardness, index and absorption. Conventional deposition systems are complex and suffer from issues including reduced wafer throughput and material contamination issues, which limits film quality and requires extended preventative maintenance cleaning of the deposition equipment. This effects over all cost of ownership

BRIEF SUMMARY

In one aspect, the invention features a method for deposition comprising flowing a first gas into a metallization zone maintained at a first pressure. A second gas flows into a reaction zone maintained at a second pressure. The second pressure is less than the first pressure. A rotating drum includes at least one substrate mounted to a surface of the drum. The surface alternately passes through the metallization zone and passes through the reaction zone. A target is sputtered in the metallization zone to create a film on the at least one substrate. The film on the at least one substrate is reacted in the reaction zone.

In another aspect, the invention features a deposition system comprising a metallization zone including a sputtering system for depositing a film on the at least one substrate sputtered from a target and pressurized with a first gas at a first pressure. A reaction includes an ionization source and is pressurized with a second gas at a second pressure. The second pressure is less than the first pressure. A drum is configured to hold at least one substrate mounted to a surface of the drum. Upon rotation of the drum the surface alternately passes through the metallization zone and passes through the reaction zone. The metallization zone is proximate to a first location of the drum. The reaction zone is proximate to a second location of the drum. The distance along a circumference of the drum from the first location to the second location exceeds a mean free path of the second gas.

In another aspect, the invention features a deposition system comprising a metallization zone including a sputtering system for depositing a film on the at least one substrate sputtered from a target and pressurized with a first gas at a first pressure. A reaction zone includes an ionization source and is pressurized with a second gas at a second pressure. The second pressure is less than the first pressure. The reaction zone is interposed between a pair of inner baffles and includes a reaction zone pump. The inner baffles are interposed between a pair of differential pumps. The differential pumps are interposed between a pair of outer baffles. The reaction zone pump is configured to pump the reaction zone to the second pressure. The pair of differential pumps is configured to assist a main chamber pump to pump the metallization zone to the first pressure, the main chamber pump is in communication with the metallization zone and the reaction zone. A drum is configured to hold at least one substrate mounted to a surface of the drum. Upon rotation of the drum the surface alternately passes through the metallization zone and passes through the reaction zone. The metallization zone is proximate to a first location of the drum. The reaction zone is proximate to a second location of the drum. The distance along a circumference of the drum from the first location to the second location exceeds a mean free path of the second gas.

BRIEF DESCRIPTION OF THE SEVERAL VIEWS OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Embodiments of deposition systems described herein provide for deposition of metallic films and their subsequent reaction with improved throughput and quality over conventional systems. For example, and without limitation, an aluminum film is deposited on a silicon wafer and then subsequently reacted with oxygen to form $Al_2O_3$ as a dielectric in a semiconductor component. Other example films are $SiO_2$, TiN and TiC. In other examples, multiple metallic film layers are deposited, each with a different index of refraction to produce a high quality optical coating. In another example, multiple reactive gases are alternately used to form SiOxNx materials. In another example, multiple metallic targets are used with an inert gas in the reaction zone to form precise multilayer films for X-ray mirrors. Many combinations of metal films and reactive gases are usable with the embodiments described herein in an efficient manner with less cross contamination of materials and improved consistency of deposition.

Figure 1:
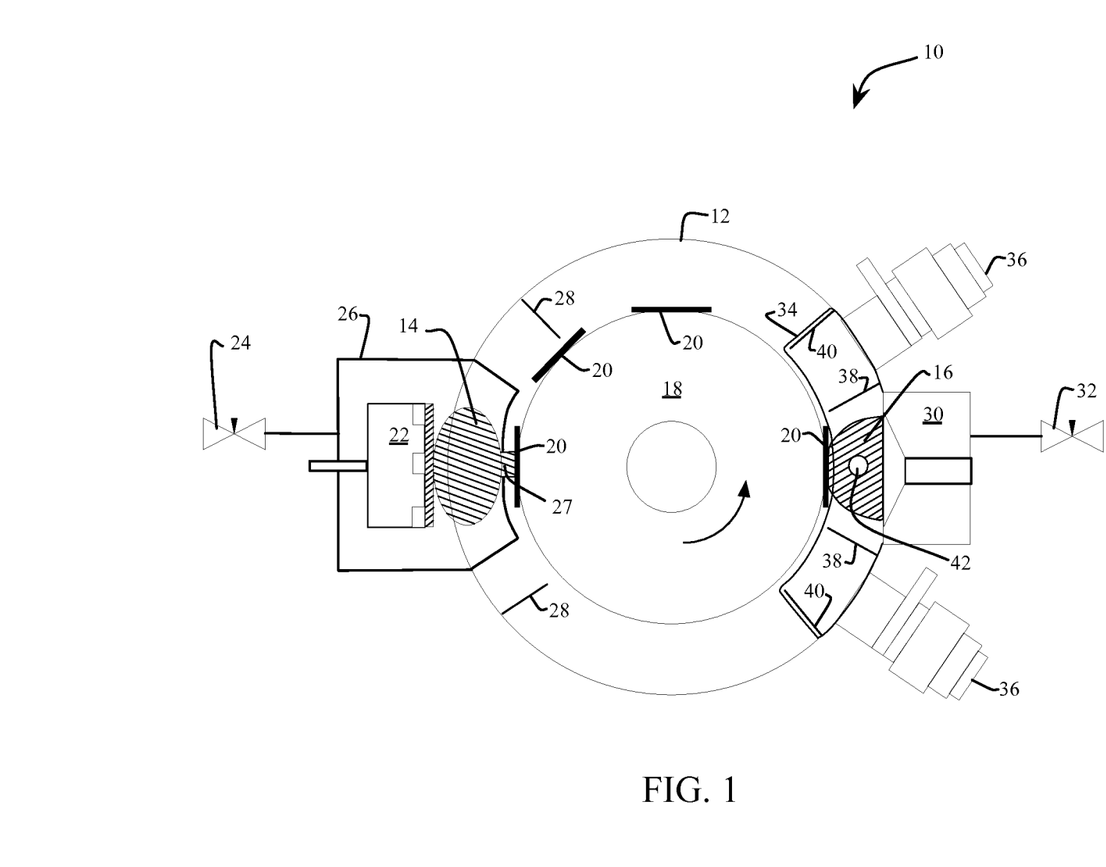
FIG. 1 is schematic top view of an embodiment of a deposition system according to the invention.

FIG. 1 shows a preferred embodiment 10 of a deposition system in accordance with the invention. The embodiment 10 includes an outer enclosure 12 with a separate metallization zone 14 and a reaction zone 16. A drum 18 has a plurality of substrates 20 affixed to the outer surface of the drum 18 so that rotation of the drum 18 causes at least one of the substrates 20 to alternately pass through the metallization zone 14 and the reaction zone 16. In other embodiments the drum 18 is replaced with a different shape other than circular. For example, a hexagonal drum is used to accommodate larger substrates. It is envisioned that other drum shapes are used in other embodiments to accommodate substrates of different size, thickness and shapes.

The metallization zone 14 includes a magnetron 22 fed by an inert gas source 24. The magnetron 22 is enclosed in a vestibule 26 and has an aperture 27. The aperture allows pressure introduced into the vestibule to build up to a pressure higher than in the reaction zone. The inert gas source is preferably Argon but can also be other inert gas such as Xenon for example. A pair of outer baffles 28 are arranged to assist in the maintaining of the pressure developed from the gas source 24 feeding an inert gas into the metallization zone 14 and exiting through a pump (not visible in FIG. 1). The baffles 28 extend close to the drum 18 while maintaining separation from the substrates 20 as they rotate through the metallization zone 20. The distance of the aperture from the drum surface 18 also determines the pressure buildup in the vestibule 26.

The reaction zone 16 includes an ion source 30 fed by a gas source 32. The gas is preferably a reactive gas including but not limited to Oxygen or Nitrogen but may also be an inert gas such as Argon. In one embodiment, a hollow cathode electron source 42 is used to inject electrons into the reaction zone 16 to maintain plasma neutrality or a zero net charge of positively and negatively charged ions in the reaction zone 16. A pair of inner baffles 38 and outer baffles 40 assist with maintaining the pressure in the reaction zone 16 caused by the inflow of gas from the gas source 32 and exiting through a pair of differential pumps 36. The reaction zone 16 is further enclosed by an enclosure 34 to assist with maintaining the reaction zone pressure. In addition, the metal film being deposited on the substrate 20 is itself an additional selective pump of the reactive gas in the reaction zone. Both the differential pumps 36 and the film itself act to reduce any residual reactive gas to levels that cannot appreciably penetrate into the higher pressure metallization zone 14. A final pumping step is the subsequent selective pumping of any reactive gases that enter the metallization zone 14 by the sputtered metal atoms and are getter-reacted on the inner walls of 26. The low mean free path of any $O_2$ molecules, for example within the higher Argon background pressure metallization zone 14 causes any $O_2$ gas to be reacted and gettered before contact with the target.

Figure 2:
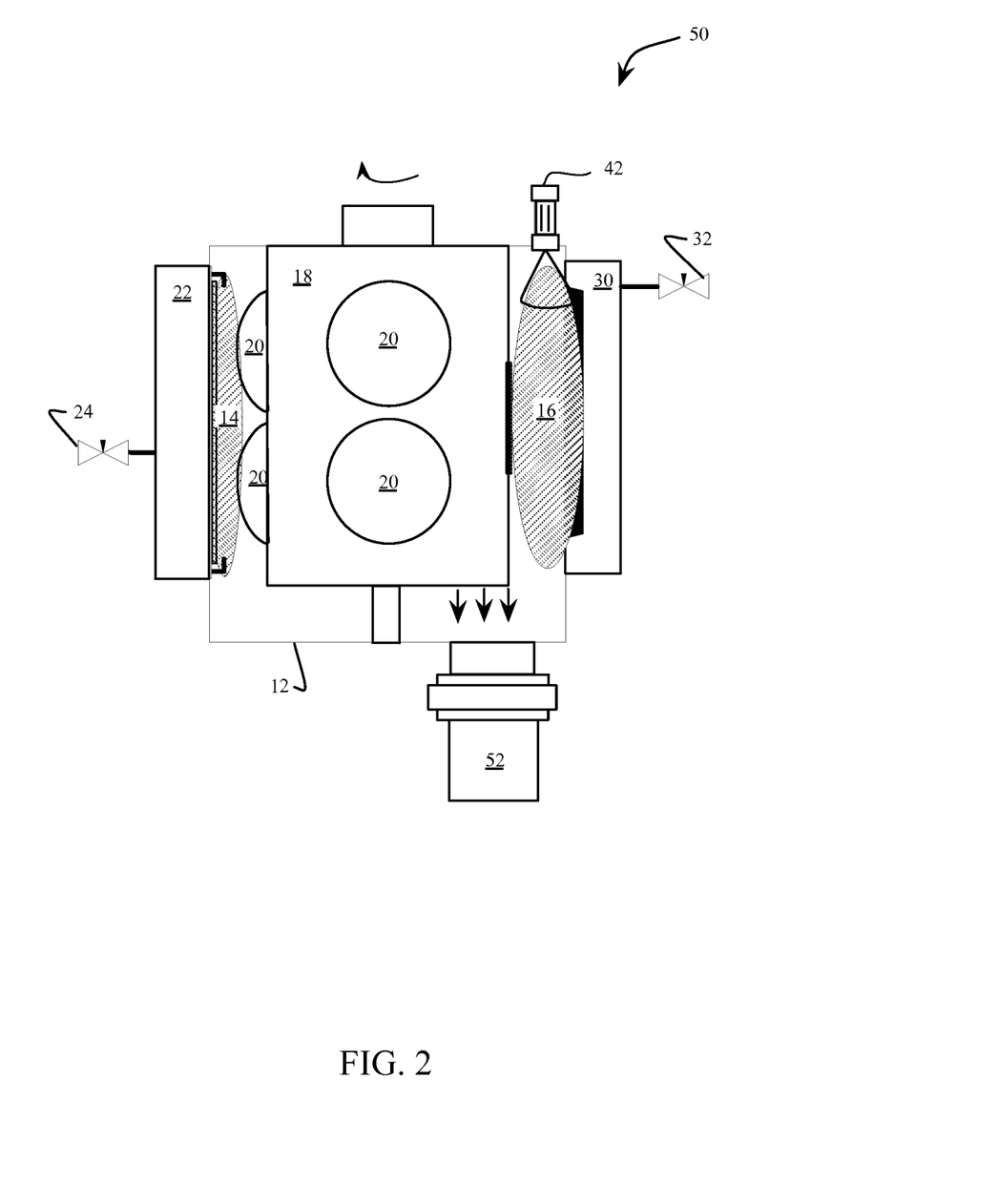
FIG. 2 is partial cross-sectional view of the deposition system shown in FIG. 1.

In one embodiment, the system 10 is pumped to a base pressure $P_b$ and the metallization zone 14 is filled with Argon gas, with the metallization zone 14 maintained at a pressure Pa, $1\times10^{-3}$ to $1\times10^{-2}$ Torr for example. A reactive gas such as $O_2$ is flowed into the reaction zone 16 through source 32 and maintained at a pressure Pr, where Pr is substantially less than Pa, $1\times10^{-4}$ to $5\times10^{-4}$ for example. The Argon gas is positively charged in the metallization zone 14 with the magnetron 22 by igniting a plasma discharge with a direct current (DC), pulsed or radio frequency (RF) power supply. The positively charged Argon ions strike a metal target mounted on the magnetron 22 resulting in sputtering of a metal film on the substrate 20 as it passes through the metallization zone 14. The substrate 20 then passes through the reaction zone 16 upon rotation of the drum 18. The reactive gas is ionized into a plasma with the ion source 30. In one embodiment the ion source is an electron cyclotron resonance (ECR) plasma source. The substrate 20 with the deposited metal film is then reacted and densified in the reaction zone 16. For example, an aluminum film would be converted to $Al_2O_3$ if $O_2$ were the reactive gas in the reaction zone 16 and aluminum were the target used in the metallization zone 14. The ion source 30 should be understood to include any plasma or ion source suitable to activate the reactive gas or species (e.g. $O_2$) and accelerate into the substrate 20 to cause a substantially complete reaction between the reactive gas and the deposited metal to form a stoichometric film or alloy and to densify the film. FIG. 2 further illustrates the system described in FIG. 1. The pump, a cryogenic pump for example, 52 is used to discharge the Argon used in the metallization zone 14 and in part the reactive gas used in the reaction zone 16. The reaction gas is discharged through a combination of pump 52 and the differential pumps 36 controlled in part by the spacing of the baffles 38 and 40 relative to the rotating drum 18.

In one example, the system 10 is operated by rotating the drum 18 at a fixed speed. A reactive gas is set to a pressure Pr and the ion source is ignited. The energy and flux of the ion source is adjusted for the required reaction. Argon gas is flowed into the metallization zone 14 and the flow of Argon is adjusted to a pressure Pa. The magnetron 22 is then ignited to form a plasma and the power to the magnetron 22 is adjusted to a power P such that 5-7 Angstroms (A) of metal film are deposited on a substrate 20 for each revolution of the drum 18. The substrate 20 is then passed through the reaction zone to react the deposited film and then the drum subsequently passes the substrate back to the metallization zone 14 to deposit another metal film. With this method, the film growth is rapid, stable and predictable due to the linear relationship of magnetron power to metal film deposition rate. As the target in the magnetron 22 erodes predictably and the deposition rate drops, the operator of the system 10 increases the power to the magnetron 22 to maintain a substantially constant deposition rate. In one example, this adjustment of magnetron power is controlled automatically by an algorithm based on the time the system 10 has been in operation.

For example, if 5 A (e.g. $5\times10^o$ m) are deposited for each revolution of the drum 18, at a drum revolution of 100 rpm, one will deposit 500 A of reacted film in one minute and 5000 A in ten minutes. The rate of deposition is further limited by the reaction time of the reactive gas, which is further limited by the maximum ion flux or beam current that can be delivered by the ion source 30.

A further example of settings used in the system 10 uses a cathode measuring three inches by six inches (the cathode being part of the magnetron 22 described below) and 900 watts of DC power applied to the magnetron 22, which produces a deposition rate of 32 A of aluminum for each second that the substrate is in the metallization zone. This is referred to as the "static" deposition rate. For a drum 18 rotating at 60 rpm, a "dynamic" deposition rate of 1.15 A/rev. is produced for a typical metallization zone and substrate. If the magnetron 22 power is increased to 1500 watts the static deposition rate would be approximately 1.66 greater than the rate using 900 watts resulting in a 53 A/sec static deposition rate. In one example of system 10 a dynamic rate of 5 A/rev. of aluminum is deposited using 3.6 kW of magnetron power and a drum 18 rotation rate of 60 rpm. A reactive flux of oxygen $O_2^+$ must be maintained at a sufficient magnitude to convert the deposited aluminum film to a stoichiometric $Al_2O_3$ film for pass of the substrate 20 through the reaction zone 16. According to the molecular formula for $Al_2O_3$ 50% more $O_2^+$ ions are required than aluminum to completely react the film. For example, a metal deposition rate of 5 A/rev. is equivalent to a metal flux of $3 \times 10^{15}$ atoms/cm$^2$/sec. at a drum 18 revolution rate of 60 rpm. An $O_2^+$ ionized flux of similar magnitude with an average energy of approximately 30-60 eV/atom is used to react the film to produce $Al_2O_3$. It is important not to exceed an upper limit of the eV/atom energy by too much, because re-sputtering of the deposited film will interfere with the deposition process. In addition, beyond this energetic threshold the energetic ions can re-sputter portions of the film causing non-stoichiometric films or implant into the film thereby causing localized stress defects. This upper limit is determined by the specific film being deposited.

Because the reactive time in the reaction zone 16 is limited by the ion current or flux, it is important that the ion source 30 be as close to the substrate 20 as possible. With a linear ion source is it possible to get much closer to the substrate 20 than to arrange a series of circular sources along the height of the drum 18. If a circular ion source is used, the arrangement of the sources must be raised above the substrate so that the ion source height and separation from the substrate 20 gives a flux distribution, (which is the sum of the individual sources) being uniform across the substrate. For example, for a drum 18 that is approximately three feet in height, the ion sources should be 5-8 inches above the substrate. This close proximity is not possible with multiple circular sources due to beam superposition issues. In contrast, the magnetron 22 does not have to be in such close proximity to the substrate 20 because the magnetron 22 can support large power densities.

Figure 3:
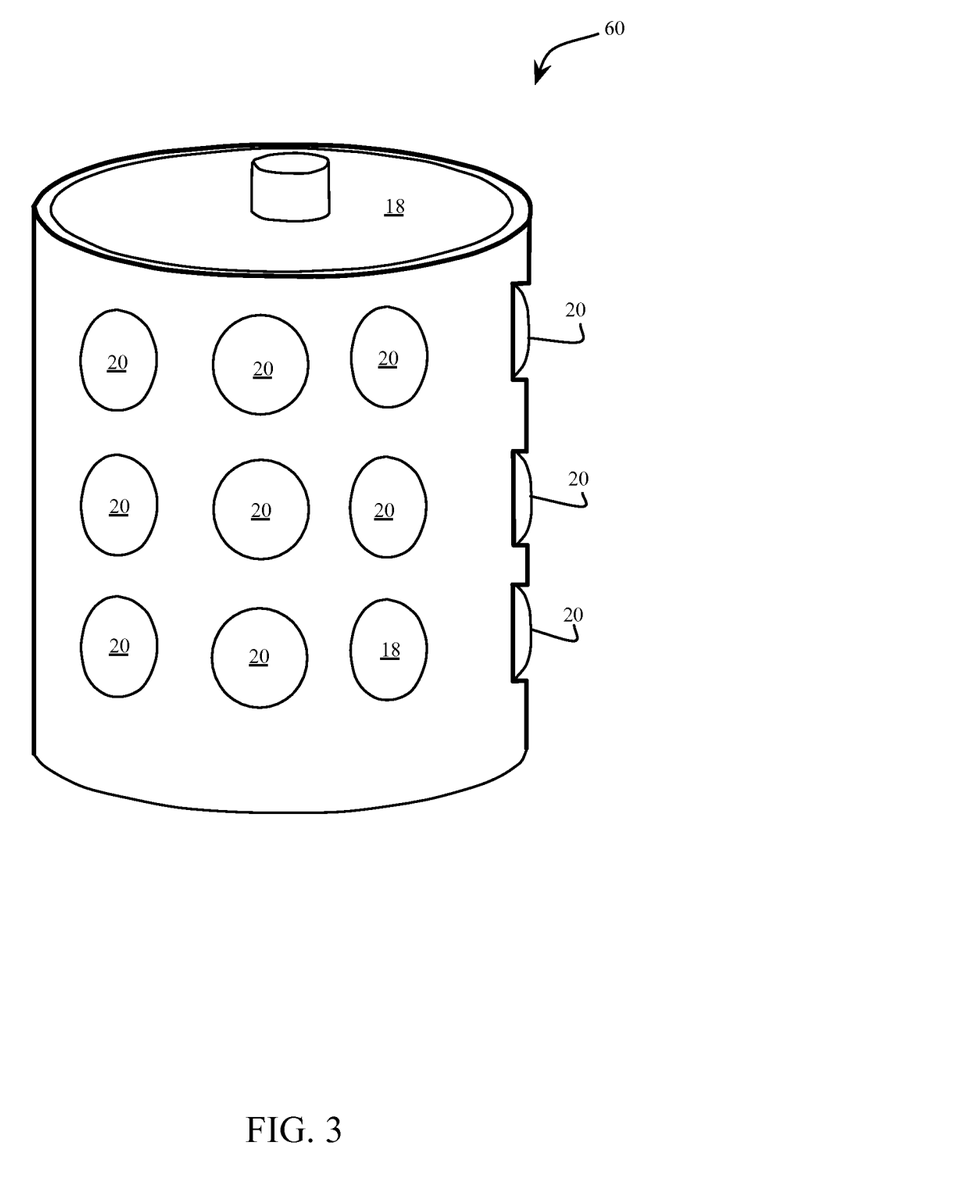
FIG. 3 is perspective view of an embodiment of a drum usable with the deposition system in FIG. 1

The close proximity of the ion source 30 to the substrate 20 and the baffles 38 and 40 to the drum 18 can limit the substrate 20 thickness and curvature. In this case, the drum 18 can have a retro-machined or recessed surface within which the substrate 20 is held. FIG. 3 shows a drum 18 with a retro-machined surface for each substrate 20. In one example, the top of the substrate 20 is "proud" (e.g. flush) to the surface of the drum 18. Further variations to the drum shape are considered within the scope of the invention, including replacing the substrate with another object to receive a metal film.

Figure 4:
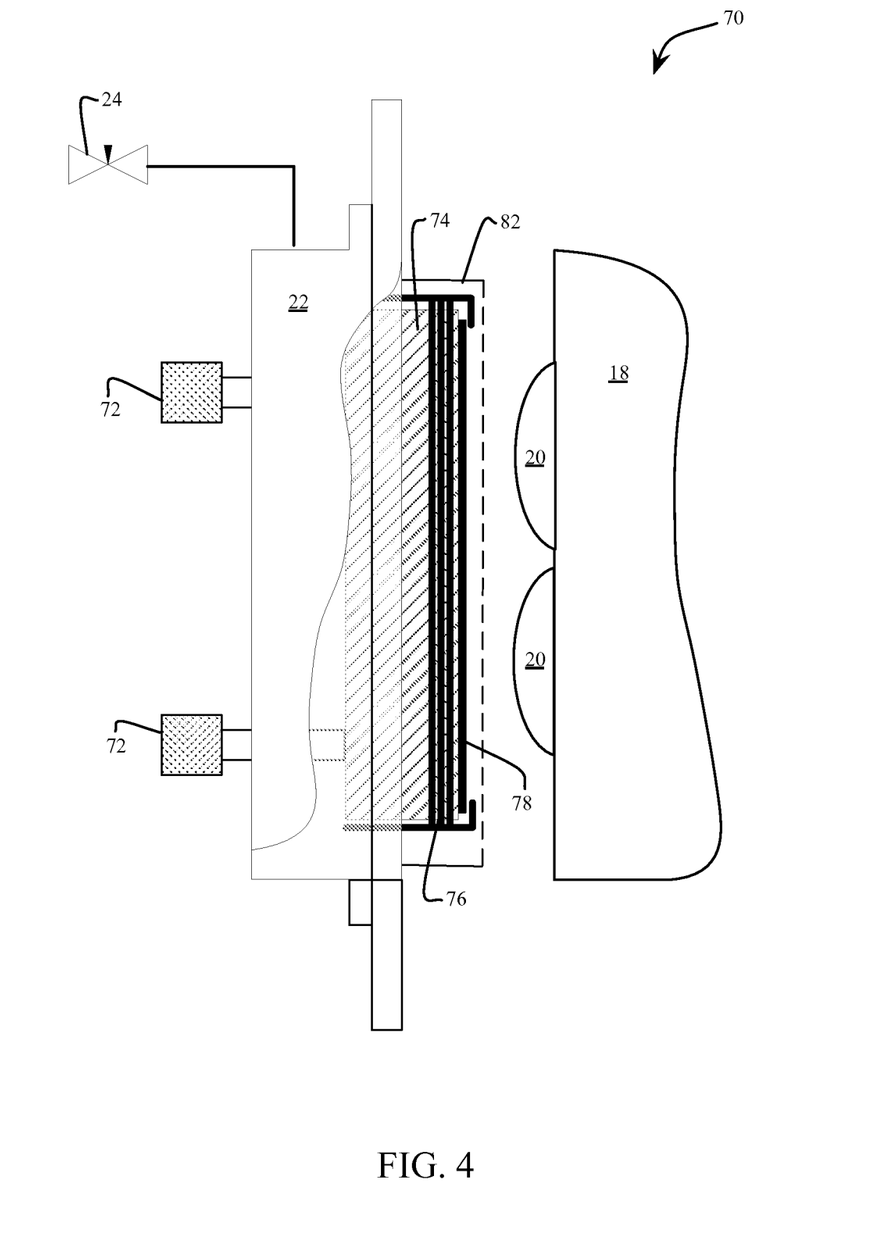
FIG. 4 is a schematic view of an embodiment of a metallization zone usable with the deposition system in FIG. 1

Uniformity and stress of film deposition is further enhanced by adjusting the pressure Pa in the metallization zone 14 and the target to substrate 20 distance or the pressure-distance product (PxTsd). Adjusting Tsd is facilitated by mounting the magnetron 22 within a flanged housing with adjustment rods 72 as shown in FIG. 4. Adjusting the pusher rods 72 moves the magnetron 22 closer to the substrate 20 mounted on the drum 18. In a preferred embodiment, the magnetron 22 includes a mask 82 between a target 78 and the substrate 20. An anode 76 is disposed between the target 78 and a cathode 74 and is designed to have a small annular portion between the target 78 and the substrate 20. In one example, the anode is biased to a ground potential and the cathode 74, which electrically communicates with the target 78 is biased to a negative potential less than ground. The positively charged inert molecules (e.g. Ar+) will accelerate towards the negatively charged target 78 and impact the target resulting in sputtering.

To achieve optimum uniformity of deposited material on the substrate 20 using a linear magnetron, the magnetron length should be substantially equal to the drum 18 height plus twice the target width. For example if the drum 18 is one meter in height and the magnetron is 10 cm. wide, the magnetron length should be approximately 1.2 meters. In one example, gas lines to and from the gas source 24 and supplying the magnetron 22 are chosen to substantially eliminate a pressure gradient along the magnetron length so enhance film linear uniformity.

Figure 5:
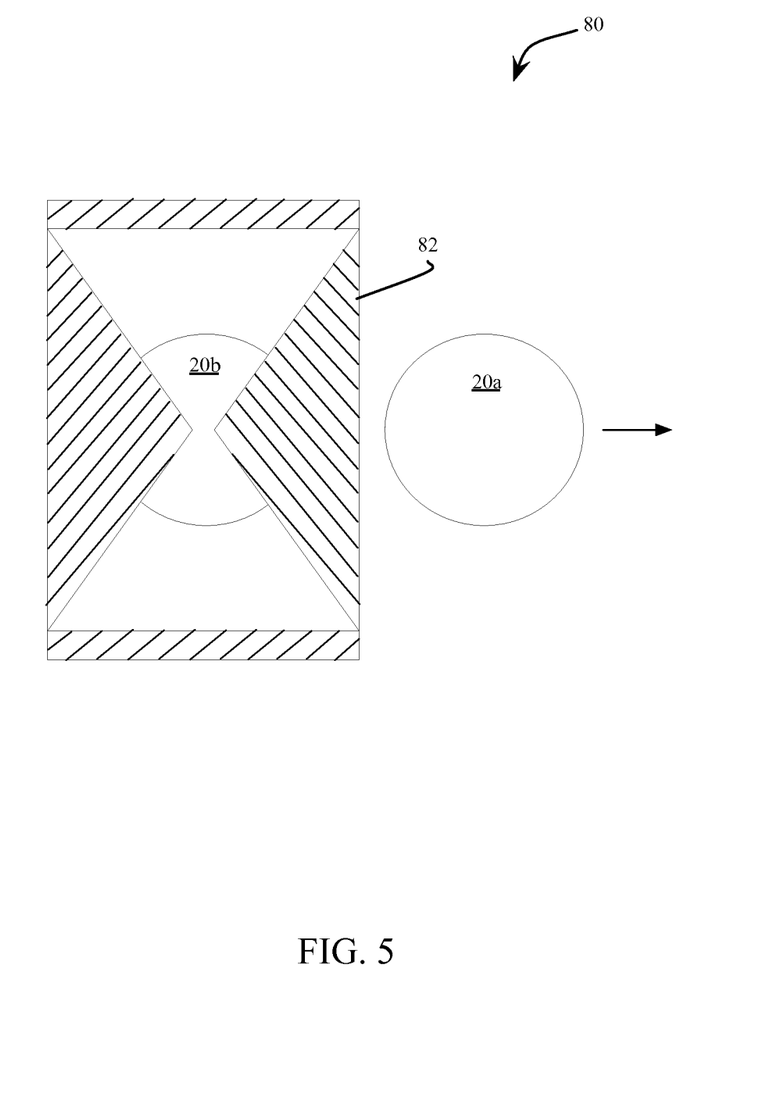
FIG. 5 is a schematic view of an embodiment of a sputtering mask positioned relative to two substrates.

In a preferred embodiment, a mask 82 as shown in FIG. 5 is used to enhance deposition uniformity. The mask 82 is interposed between the magnetron 22 and the substrate 20 and is shaped to account for local film variations. For a flat substrate 20 the mask 82 produces a linear wave front of sputtered material to the substrate 20. Various alterations to the mask are used to shape the wave front to match the surface of non-planar substrates, for example a convexed or concaved substrate. FIG. 5 further illustrates the positioning of the mask 82 relative to a substrate 20a that has just exited the metallization zone 14 and a substrate 20b that is within the metallization zone 14. The deposited metal film uniformity primarily determines the reacted film uniformity. This is because the ion source 30 is typically operated in the saturation mode. In other words, slightly more current is delivered to the ion source 30 than is needed to cause saturation of the film stoichiometry. For example, if the voltage of the ionized reactive gas is kept sufficiently low (e.g. less than 100-125 eV) the deposited reacted film's molecular bonds will not be broken and stoichiometry is maintained in the reacted film. Once stoichiometry is reached, the film is stable. In an embodiment where the system 10 is configured to make alloys, the ion source 30 is operated at a setting between zero energetics and less than saturation to obtain a film of any composition.

In one embodiment, the rotating drum 18 is cooled with a liquid, for example water and has an RF, DC or pulsed electrical bias applied to enhance activation or assist through re-sputtering in the planarization of a substrate with photolithographic features. The linear magnetron 22 in the present invention easily lends itself to a hidden anode 76 design as shown in FIG. 4. In prior solutions using reactive sputtering, the anode is also the substrate and becomes coated with an insulator. The electrons in the plasma can therefore no longer return to ground, and an accumulation of charges causes the plasma to spread out to the substrate seeking a return path to ground. The magnetron plasma now is in contact with the substrate, which results in undesirable substrate heating. A hidden anode 76 as shown in FIG. 4 overcomes this problem because the anode will not be coated with an insulator and this in turn keeps the plasma confined to the target 78 thereby reducing the substrate heating.

In prior solutions, the magnetron 22 is purposely operated in an unbalanced mode. In this mode the plasma is made to extend to the substrate 20 thereby adding an ion assist to the substrate from the Argon ions in the magnetron plasma. This plasma extension provides for film and gas reactivity however it is combined with the metallization zone. In this unbalanced configuration, a high power and high film deposition rate will put severe constraints on the substrate temperature and corresponding cooling requirements. Unlike the prior solutions, the present invention separates the metallization zone 14 and the reaction zone 16 in an effective manner.

In a preferred embodiment, the substrates 20 are mounted vertically as shown in FIG. 3 and a linear magnetron 22 is now used for film deposition. Every point on a vertical line of the substrate spend the same time under the deposition flux while in the metallization zone 14 thus substantially eliminating the center to edge film thickness variation or gradient along the substrate 20. Prior solutions that are encumbered by this film gradient are required to use a delta-shaped magnetron to produce uniform films at added expense and system complexity. Even with the delta-shaped magnetron, a mask is still required to enhance uniformity. In the present invention, no such gradient exists, thereby allowing use of a standard linear magnetron with standard targets.

Due to the complete separation between the metallization zone 14 and the reaction zone 16, the system 10 operates in an open-loop with little dependency between the zones and without the risk of reactive sputter hysteresis which "poisons" or oxidized the metal target 78 and consequently shuts down the sputtering process. Furthermore separation of the zones avoids the requirement to use pulsed sputtering or other devices to reduce arc events due to target poisoning although in one example pulse sputtering is used to enhance ionization at the target for effecting film properties. Separation of the metallization zone 14 and the reaction zone 16 and consequently the reduction in target poisoning, requires a pressure differential between the zones of approximately one order of magnitude and a physical separation greater than the mean free path of the reactive gas. In one example, the metallization zone 14 has a pressure Pa of $1 \times 10^{-3}$ torr while the reaction zone 16 has a pressure Pr of $1 \times 10^{-4}$ torr. This pressure differential and mean free path difference provides a diffusive gas barrier to further enhance the isolation of the two zones. It is envisioned that a greater distance between the two zones will also permit a reduction in the pressure differential and that various combinations of pressure differential and physical separation are within the scope of the invention. The present invention overcomes limitations of previous solutions that required complicated feedback loops involving optical plasma spectroscopy or mass flow controller feedback loops to control gas flow and the magnetron power supply.

Figure 6A:
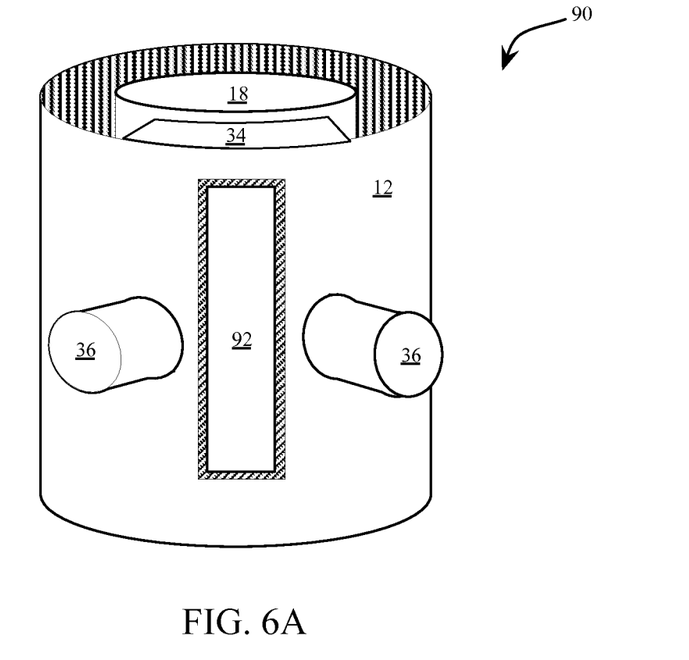
FIG. 6A is a perspective view of an embodiment of a deposition system.
Figure 6B:
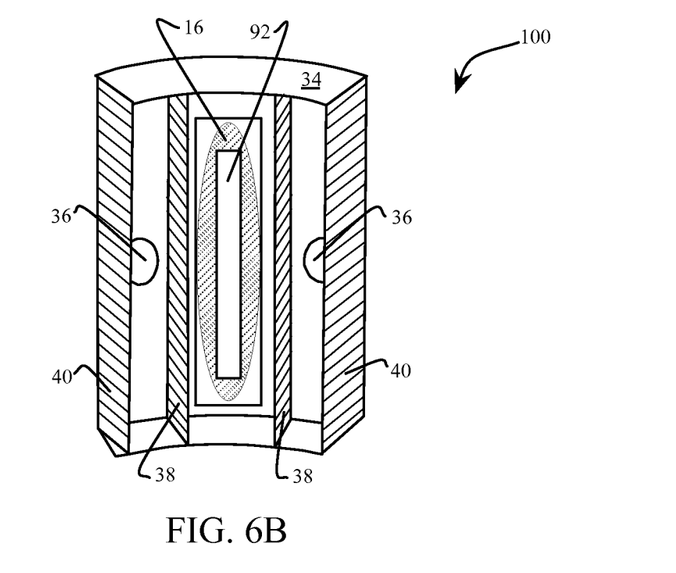
FIG. 6B is a perspective view of an embodiment of a reaction zone usable with the deposition system in FIG. 6A.

The present invention also overcomes limitations in previous solutions that require the cathode of the magnetron to be encased in a differentially pumped enclosure rather than just enclosing the reaction zone 16 in a differentially pumped enclosure. Advantageously, the present approach facilitates a system with multiple metallization zones because only the common reaction zone 16 is differentially pumped as shown in FIGS. 6A and 6B. In FIG. 6A a system 90 has an enclosure 12 with an opening 92 for the ion source 30. The reaction zone 16 is encased in an enclosure 34 and is differentially pumped with pumps 36. In FIG. 6B, the enclosure 34 includes a pair of inner baffles 38 and a pair of outer baffles 40. The differential pumps 36 are positioned outside of the inner baffles 38 and inside of the outer baffles 40. The reaction zone 16 is within the inner baffles 38.

The pumps 36 and the baffles 38 and 40 are chosen so that the pressure outside of the reaction zone 16, (between the reaction zone 16 and the metallization zone 14) is reduced to a pressure substantially less than the reaction zone 16, $1 \times 10^{-5}$ torr for example. In this case if the pressure outside of the reaction zone is Pr and the conductance of the baffles is Cb (measured in torr-liters/sec) and the reduced pressure outside the enclosure 34 is Po then the speed of the pumps 36 is calculated by the equation Spump=(Pr−Po)/Cb. By enclosing the reaction zone 16 and differentially pumping this zone separately from the rest of the system, pump sizes and system size are reduced, allowing the target and ion source to be more loosely coupled.

Figure 7A:
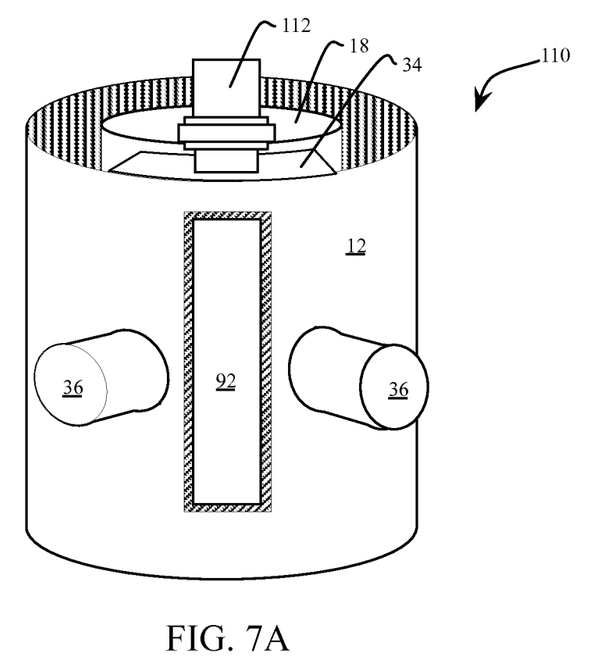
FIG. 7A is a perspective view of an embodiment of a deposition system.
Figure 7B:
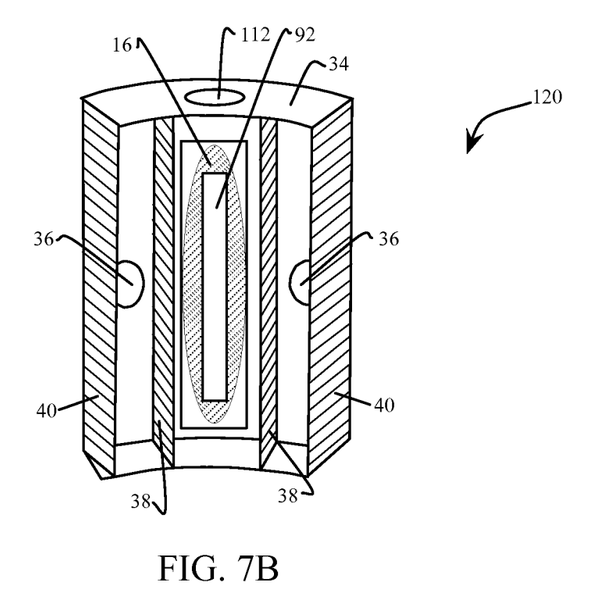
FIG. 7B is a perspective view of an embodiment of a reaction zone usable with the deposition system in FIG. 7A.

In one of the preferred embodiments the reaction zone 16 includes an additional pump 112 positioned between the inner baffles 38 as shown in FIGS. 7A and 7B. With the addition of pump 112, the baffles 38 and 40 can be moved closer to the drum 18 for improved isolation of the reactive gases from the rest of the system. In another embodiment, the pair of inner baffles 38 is moved closer to the drum 18 and the pair of outer baffles 40 are moved further away from the drum 18 such that the differential pumps 36 providing differential reduction of the reactive gas can now be used to also pump the inert gas from the metallization zone thereby eliminating the need for pump 52 shown in FIG. 2. The speed of the pump 112 is limited by the conductance of the aperture crated by the outer baffles 40 and the speed of the pump 112.

Figure 8A:
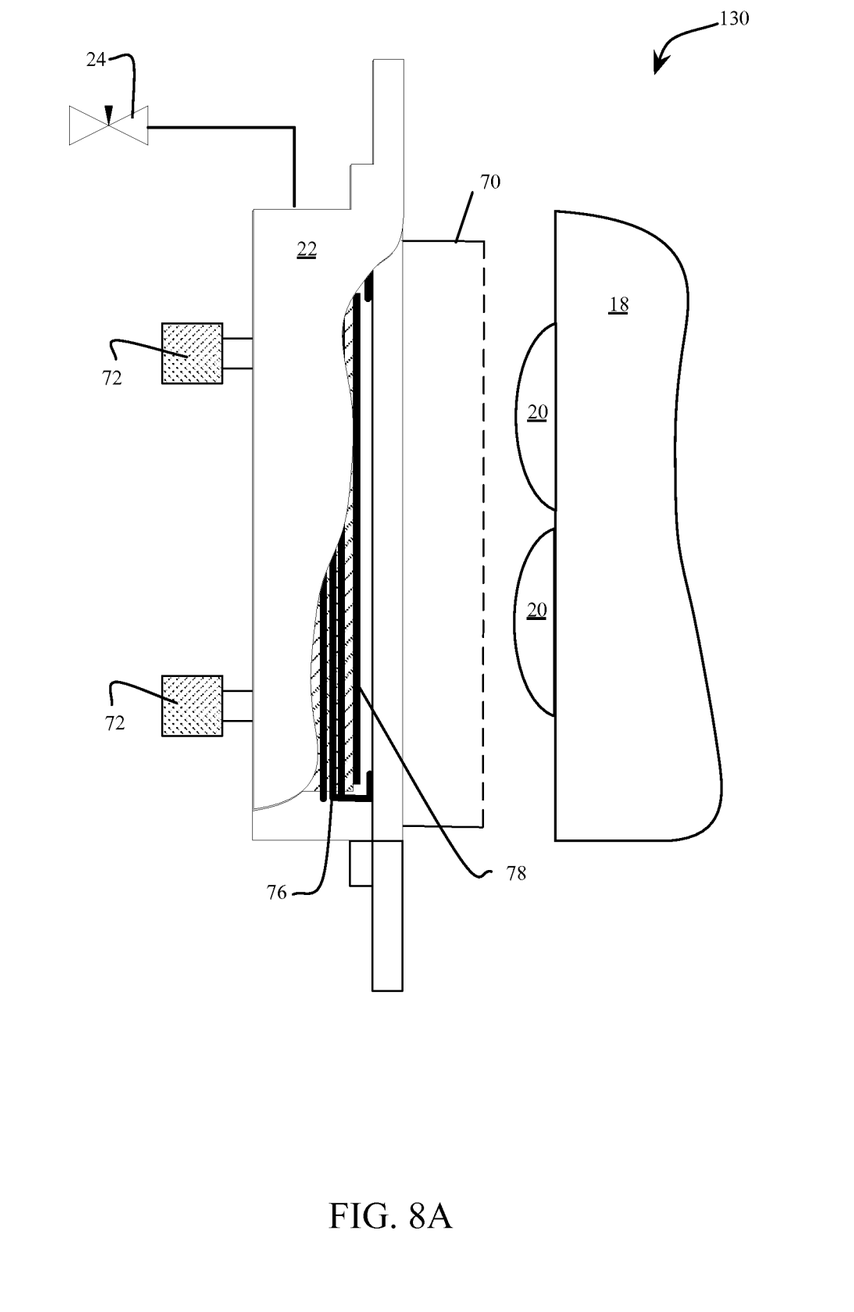
FIG. 8A is a schematic view of an embodiment of a metallization zone usable with the deposition system in FIG. 7A.

With the improved isolation of the reactive gases as shown in FIGS. 7A and 7B, the linear magnetron 22 can be positioned further from the substrate 20 as shown in FIG. 8A. Advantageously, this further reduces particles on the substrate 20. Because the inert gas is introduced within the magnetron 22 locally, then the open area through which the inert gas is pumped is effectively a sputter aperture with conductance Ca.

Figure 8B:
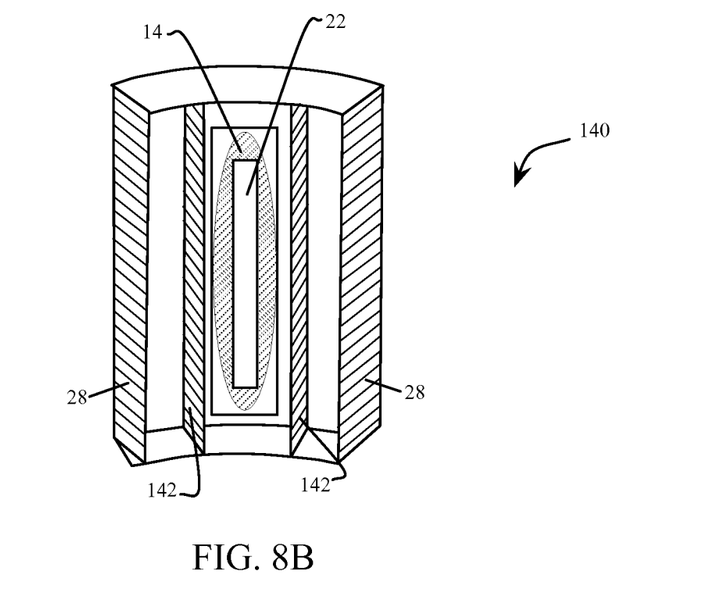
FIG. 8B is a schematic view of an embodiment of the metallization zone.
Figure 8C:
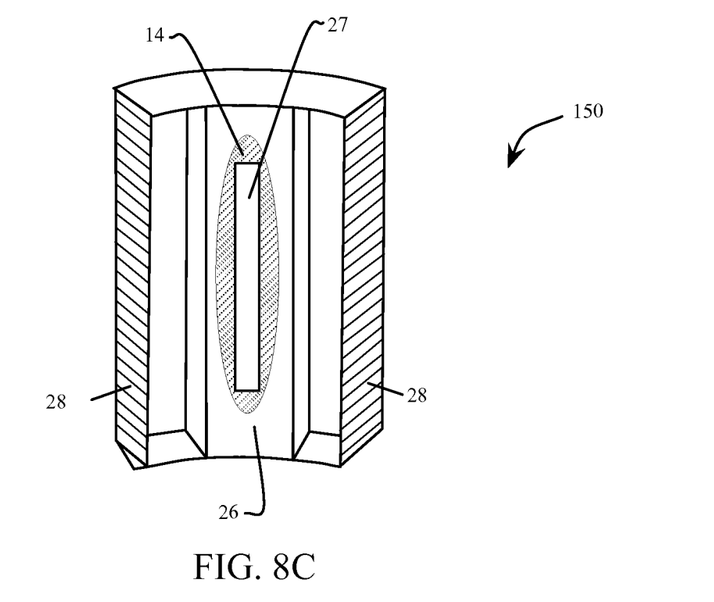
FIG. 8C is a schematic view of an embodiment of the metallization zone with an aperture formed by an aperture shield.

FIG. 8B shows an embodiment of the metallization zone 14 where the plasma from the magnetron 22 is substantially confined by a pair of inner baffles 142. FIG. 8C shows one of the preferred embodiments of the metallization zone 14 where the plasma is confined by an aperture 27 formed by an aperture shield 26. If the pressure in this sputter vestibule 26 is fixed at pressure Pa and assuming the main pump 52 speed is much higher than the speed of the differential pumps 36 and the main pump 52 has a speed $P_{speed}$, then the size of the aperture can then be calculated to maintain $P_a$. The distance of the aperture plate from the substrate holder (e.g. drum) 18 also contributes to the pressure build up in the vestibule 26.

The vertical orientation of the deposition in the metallization zone 14 advantageously reduces the susceptibility of particles landing on the substrate 20. Unlike prior solutions that used downward facing deposition the requirement for shutting down the system for maintenance is reduced and the use of full-face erosion targets to minimize target re-deposition is eliminated. Delta magnetrons as used in the prior solutions have a long meandering non-sputtered zone, which becomes saturated with re-deposited film. This film will over time "spall" off due to stress, which greatly contributes to undesirable particles reaching the substrate 20. By using a linear magnetron 22 whose re-deposition area is substantially less than a delta magnetron, particles are reduced in thick coatings.

A further advantage of the system 10 with monolayer deposition, and high speed passing through the zone with inert gas and subsequent conversion to a dense stoichometric reacted layer is the significant reduction of the inert gas in the substrate 20. By reducing the inert gas (e.g. Argon) in the substrate 20, defect induced stress variation is greatly reduced. The reacted film stress is then controlled by film densification with a process known as atomic penning due to the ion source. The stress control is achieved by controlling the atom/ion ratio (e.g. metal atom flux to ion flux ratio) and momentum exchange of the ion at the surface. By controlling magnetron 22 power, anode 76 current and anode 76 voltage the film stress can be varied or controlled or alternatively, magnetron 22 power, anode 76 current and anode 76 voltage can be held constant and the atom/ion ration and metal rate per revolution of the drum 18 is controllable by varying the drum 18 rotation speed.

In one embodiment a second magnetron is added to the system 10 to form high and low index metal oxide layers on a substrate 20 to produce high quality optical coatings. For example, a Silicon target in one magnetron and a Tantalum target in a second magnetron provides are any number of $SiO_2/Ta_2O_5$ optical coatings including anti-reflection, band bass and blocking coatings. The formation of the optimal layers is easily monitored by a gated optical monitor. Other embodiments use more than two magnetrons to provide even more complex structures. In another embodiment, two magnetrons are used each with their own metal target and the reactive gas in the reaction zone 16 is replaced with Argon to rapidly form precise metal multilayer films from low Z materials for X-ray mirrors.

In another embodiment for multilayer coatings, an additional (e.g. second or more) magnetron is mounted within a single attached vestibule 26. The additional magnetron is used and indexed with a motor controller. In this way a layer A is deposited with magnetron A then halted and magnetron B is then rotated in position in front of the aperture, power is applied to magnetron B and a film B is deposited. This embodiment of a multiple target sputtering system greatly reduces machine foot print and cost of ownership.

In another embodiment, the gas source 32 is pulsed or alternated between different gases to form different combinations of films. For example, a Silicon target is used, with $O_2$ and $N_2$ reactive gases used sequentially to produce SiN and $SiO_2$ layers. Alternatively, an $O_2/N_2$ mixture is used to form SiONx materials.

While the invention has been shown and described with reference to specific preferred embodiments, it should be understood by those skilled in the art that various changes in form and detail may be made therein without departing from the spirit and scope of the invention as defined by the following claims.

What is claimed is:

1. A deposition system comprising
   a metallization zone including a sputtering system for metal film deposition;
   a reaction zone including an ionization source for generating at least one reactive ionic species;
   a rotatable mount configured to hold at least one substrate and to pass at least a portion of the substrate alternately through said metallization and reaction zones so as to deposit a metal film on said substrate portion in the metallization zone and to react the metal film with said at least one reactive ionic species in said reaction zone; and
   at least one diffusive gas barrier disposed between said metallization and reaction zones for maintaining a pressure differential therebetween, wherein the reaction zone comprises a pair of inner baffles interposed between a pair of differential pumps, and a pair of outer baffles between which the differential pumps are interposed.

2. The system of claim 1, further comprising an electrical bias for application to said substrate.

3. The system of claim 1, wherein the sputtering system comprises an anode, a cathode and a metal target and is configured to ionize a gas and to direct the ionized gas to the metal target such that an impact of the gas ions on the target results in sputtering of metal from the target onto said substrate portion, wherein the target is interposed between the anode and the gas so as to substantially isolate the anode from the gas.

4. The system of claim 1, wherein the sputtering system comprises a mask interposed between the target and the at least one substrate, the mask configured to form a wavefront of a sputtered material parallel to a surface of the at least one substrate.

5. The system of claim 1, further comprising another metallization zone including a second sputtering system for depositing another metal on the substrate portion.

6. The system of claim 1, wherein the sputtering system includes a magnetron with a length substantially equal to a height of the rotatable mount plus twice a width of the target and wherein the length of the magnetron is collinear with the height of the rotatable mount and is perpendicular to the width of the target.

7. The system of claim 1, wherein the ionization source is a linear ion source.

8. The system of claim 1, wherein the metallization zone is pressurized with a first gas at a first pressure and the reaction zone is pressurized with a second gas at a second pressure, and wherein said second pressure is less than said first pressure.

9. The system of claim 1, wherein the reaction zone is configured to switch the second gas with another reactive gas after a number of rotations of the rotatable mount.

10. The deposition system of claim 8
    wherein a distance between the metallization zone and the reaction zone along the circumference of the rotatable mount exceeds a mean free path of the second gas at said second pressure.

11. The system of claim 1, further comprising a liquid coolant for cooling said rotatable mount.

12. The system of claim 8, wherein the reaction zone further comprises an electron source for injecting electrons into the reaction zone so as to maintain plasma neutrality.

13. The system of claim 2, wherein said electrical bias comprises any of a DC, RF or pulsed electrical bias.

14. The system of claim 1, wherein said at least one barrier comprises at least a pair of baffles disposed between the metallization zone and the reaction zone.

15. The system of claim 8, wherein the first gas comprises an inert gas and the second gas comprises a reactive gas.

16. The system of claim 15, wherein said inert gas comprises any of argon and xenon, and wherein said reactive gas comprises oxygen.

17. The system of claim 16, wherein said metal target comprises aluminum.

18. The system of claim 8, wherein said first pressure is in a range of about $1\times10^{-3}$ to about $1\times10^{-2}$ torr.

19. The system of claim 8, wherein said second pressure is in a range of about $1\times10^{-4}$ to $5\times10^{-4}$ ton.

20. The system of claim 6, wherein said magnetron is enclosed in a vestibule configured to receive gas from a gas source, said vestibule having an aperture configured to allow a pressure within the vestibule to build up to a value greater than a pressure in the reaction zone.

21. A deposition system comprising
    a metallization zone including a sputtering system for metal film deposition,
    a reaction zone including an ionization source for generating at least one reactive ionic species; and
    a rotatable mount configured to hold at least one substrate and to pass at least a portion of the substrate alternately through said metallization and reaction zones so as to deposit a metal film on said substrate portion in the metallization zone and to react the metal film with said at least one reactive ionic species in said reaction zone, and means for maintaining a pressure differential therebetween, wherein the reaction zone comprises a pair of inner baffles interposed between a pair of differential pumps, and a pair of outer baffles between which the differential pumps are interposed.

22. The system of claim 21, wherein said means is configured to maintain a pressure in the reaction zone that is less than a respective pressure in the metallization zone.

23. The system of claim 21, wherein said means comprises at least a pair of baffles disposed between the metallization and the reaction zones.

24. The system of claim 21, wherein said metallization zone is pressurized with a first gas at a first pressure and said reaction zone is pressurized with a second gas a second pressure less than said first pressure.

25. The system of claim 24, wherein a distance between said metallization zone and said reaction zone along a circumference of said rotatable mount exceeds a mean free path of said second gas at said second pressure.

* * * * *